United States Patent
White et al.

(10) Patent No.: US 6,477,095 B2
(45) Date of Patent: Nov. 5, 2002

(54) METHOD FOR READING SEMICONDUCTOR DIE INFORMATION IN A PARALLEL TEST AND BURN-IN SYSTEM

(75) Inventors: Keith Jordan White, Richmond, VA (US); Mark Daniel Eubanks, Mechanicsville, VA (US)

(73) Assignee: Infineon Technologies Richmond, LP, Sandston, VA (US)

( * ) Notice: Subject to any disclaimer, the term of this patent is extended or adjusted under 35 U.S.C. 154(b) by 28 days.

(21) Appl. No.: 09/751,555

(22) Filed: Dec. 28, 2000

(65) Prior Publication Data

US 2002/0085439 A1 Jul. 4, 2002

(51) Int. Cl.[7] .................................. G11C 7/00
(52) U.S. Cl. ................ 365/201; 365/225.7; 365/189.07
(58) Field of Search ............................. 365/201, 225.7, 365/189.07

(56) References Cited

U.S. PATENT DOCUMENTS

| | | | | |
|---|---|---|---|---|
| 4,637,020 A | * | 1/1987 | Schinabeck | 371/20 |
| 4,866,714 A | * | 9/1989 | Adams et al. | 371/22.1 |
| 4,928,278 A | * | 5/1990 | Otsuji et al. | 371/1 |
| 5,103,557 A | * | 4/1992 | Leedy | 29/407.1 |
| 5,309,446 A | * | 5/1994 | Cline et al. | 365/201 |
| 5,390,129 A | * | 2/1995 | Rhodes | 364/480 |
| 5,557,559 A | * | 9/1996 | Rhodes | 364/580 |
| 5,721,741 A | * | 2/1998 | Deas | 371/22.1 |
| 5,848,008 A | | 12/1998 | Kirihata et al. | 365/200 |
| 5,959,911 A | | 9/1999 | Krause et al. | 365/201 |
| 6,008,523 A | | 12/1999 | Narayan et al. | 257/529 |
| 6,009,536 A | * | 12/1999 | Rohwer | 714/8 |
| 6,037,792 A | * | 3/2000 | McClure | 324/760 |
| 6,081,910 A | * | 6/2000 | Mifsud et al. | 714/718 |
| 6,119,255 A | * | 9/2000 | Akram | 324/765 |
| 6,255,844 B1 | * | 7/2001 | Kawashima | 324/765 |

* cited by examiner

*Primary Examiner*—Richard Elms
*Assistant Examiner*—Tuan T. Nguyen
(74) *Attorney, Agent, or Firm*—Stanton Braden

(57) ABSTRACT

A method according to the present invention is provided for determining memory device identification. The method invokes a serial output from n identification fuses of two or more memory devices, the output for identifying the device, and sampling the serial output every $n^{th}$ bit to determine a fuse state for a fuse of each device. The method further repeats the sampling for all n fuses to acquire fuse data for all devices, and determines a pass/fail string corresponding to the sampled output, the pass/fail string being employed to identify the devices through a parallel test and burn-in system. The output is on an enabled data line which is used during the burn-in test wherein other data lines are disabled for avoiding bus contention. The method also includes storing the pass/fail string for the data in a database, and translating the pass/fail string using a structured query language expression executed against the database.

14 Claims, 4 Drawing Sheets

Pass on expect data high = binary "1"

| LOT | EQUIPMENT | NO_OF_COLUMN | NO_OF_ROW | STATUS |
|---|---|---|---|---|
| 2345 | R3 | 16 | 9 | ......F |
| 2345 | R3 | 1 | 10 | ......F.... |
| 2345 | R3 | 1 | 16 | .FF........ |
| 2345 | R3 | 2 | 2 | ......F |
| 2345 | R3 | 3 | 1 | ......F |
| 2345 | R3 | 3 | 4 | ...FFFFFFFFF |
| 2345 | R3 | 5 | 2 | .......l...... |

FIG. 4

| STATUS | FAB | SERIAL | WAFER | X | Y |
|---|---|---|---|---|---|
| .FF..F..F.F.FFF.FF.F | 3 | 1234 | 4 | 14 | 12 |
| .FF..F..F.F.FFF.FF.F | 3 | 1234 | 4 | 37 | 11 |
| .FF..F..F.F.FFF.FF.F | 3 | 1234 | 4 | 38 | 9 |
| .FF..F..F.F.FFF.FF.F | 3 | 1234 | 5 | 15 | 8 |
| .FF..F..F.F.FFF.FF.F | 3 | 1234 | 4 | 25 | 12 |
| .FF..F..F.F.FFF.FF.F | 3 | 1234 | 4 | 18 | 11 |
| .FF..F..F.F.FFF.FF.F | 3 | 1234 | 7 | 22 | 20 |
| .FF..F..F.F.FFF.FF.F | 3 | 1234 | 5 | 33 | 6 |
| .FF..F..F.F.FFF.FF.F | 3 | 1234 | 7 | 34 | 18 |

FIG. 5

METHOD FOR READING SEMICONDUCTOR DIE INFORMATION IN A PARALLEL TEST AND BURN-IN SYSTEM

BACKGROUND OF THE INVENTION

1. Field of the Invention

The present invention relates to a system and method for reading semiconductor die information, and more particularly for reading semiconductor die identification information in a parallel test and burn-in system.

2. Description of Prior Art

In some cases semiconductor chips are encoded with an identification (ID), enabling testers to trace individual chips through production. The ID can contain information such as, wafer lot number, wafer number, and coordinates on a wafer. By tracing dies through production and conducting yield studies, manufactures can optimize production of a particular chip.

Often a burn-in test is conducted as part of the production. The purpose of a burn-in procedure is to operate the devices (e.g., SDRAM) for some period of time during which most of the devices subject to infant mortality failure actually fail. The burn-in may include operating the devices under conditions of increased temperature and increased voltage (high current load). These conditions are designed to accelerate the aging process where, for example, a relatively small number of testing hours are equivalent to months of operation. The goal of a burn-in test is to increase the reliability of the devices ultimately marketed.

A test and burn-in system poses unique problems with respect to tracing dies. For example, in order to read burn-in data, a test system needs sufficient memory to capture a serial data stream for each device being tested on a real time basis using a fail memory. In such a system, the expense of the memory is economically undesirable. To this point, no satisfactory method of reading chip ID from a plurality of chips in parallel on a burn-in board is known to be available.

A second problem with tracing dies through burn-in is bus contention. Bus contention can occur when two or more devices attempt to output opposite logic levels on the same or common bus line. In a testing system, during burn-in, drivers and comparators are shared among many devices in parallel to help reduce testing costs. However, to avoid the bus contention that is associated with testing devices in parallel, the devices are tested in banks. Therefore, only one package pin of any device on the common data bus is enabled at any one time.

Therefore a need exists for an efficient system and method for reading semiconductor identification information from a burn-in test board including devices in parallel.

SUMMARY OF THE INVENTION

A method according to the present invention is provided for determining memory device identification. The method invokes a serial output from n identification fuses of two or more memory devices, the output for identifying the device, and sampling the serial output every $n^{th}$ bit to determine a fuse state for a fuse of each device. The method repeats the sampling for all n fuses to acquire fuse data for all devices, and determines a pass/fail string corresponding to the sampled output, the pass/fail string being employed to identify the devices through a parallel test and burn-in system.

The output is on an enabled data line which is used during the burn-in test wherein other data lines are disabled for avoiding bus contention. The memory device is a synchronized dynamic random access memory. The fuses are defined as identification fuses prior to invoking the output.

The method also includes storing the pass/fail string for the data in a database, and translating the pass/fail string using a structured query language expression executed against the database. A pass is interpreted as a binary "1" and a fail is interpreted as a binary "0". The pass/fail string is a binary data string. The translated pass/fail string is linked to another test. The disabled data lines are tri-state data lines.

According to one embodiment of the present invention, a computer usable medium including computer readable program code embodied therein is provided for causing the computer to determine device identification data. The computer program product includes computer readable program code for causing a computer to invoke a serial output from n identification fuses of a plurality of devices, the output for identifying the devices. The computer program product includes computer readable program code for causing a computer to sample the serial output every $n^{th}$ bit to determine a fuse state for a fuse of each device. Also included is computer readable program code for causing a computer to repeat the sampling for all n fuses to acquire fuse data for all devices. The computer program product further includes computer readable program code for causing a computer to determine a pass/fail string corresponding to the sampled output, the pass/fail string being employed to identify the devices through a parallel test and burn-in system.

The computer readable program code further includes computer readable program code for causing a computer to store the pass/fail expression for the data in a database, and structured query language computer readable program code executed against the database for causing a computer to translate the pass/fail expression.

A system for determining a memory device identification is provided according to an embodiment of the present invention. The system includes a testing board to which memory devices are wired in parallel, each memory device including one or more identification fuses, a strobe, for sampling and comparing the output from the memory devices on an enabled package pin to an expected data, and a memory for storing the results of the comparison.

In addition, the memory includes a first relational database for storing the results against which a structured query language expression is executed for translating the results, and a second relational database including at least one identification field for accepting the translated data string. The memory is an offline memory.

BRIEF DESCRIPTION OF THE DRAWINGS

Preferred embodiments of the present invention will be described below in more detail, with reference to the accompanying drawings:

FIG. 4 is a table according to one embodiment of the present invention showing a testing database; and FIG. 5 is a table according to another embodiment of the present invention showing the results of a translate chip ID string.

DETAILED DESCRIPTION OF PREFERRED EMBODIMENTS

Figure 1A:
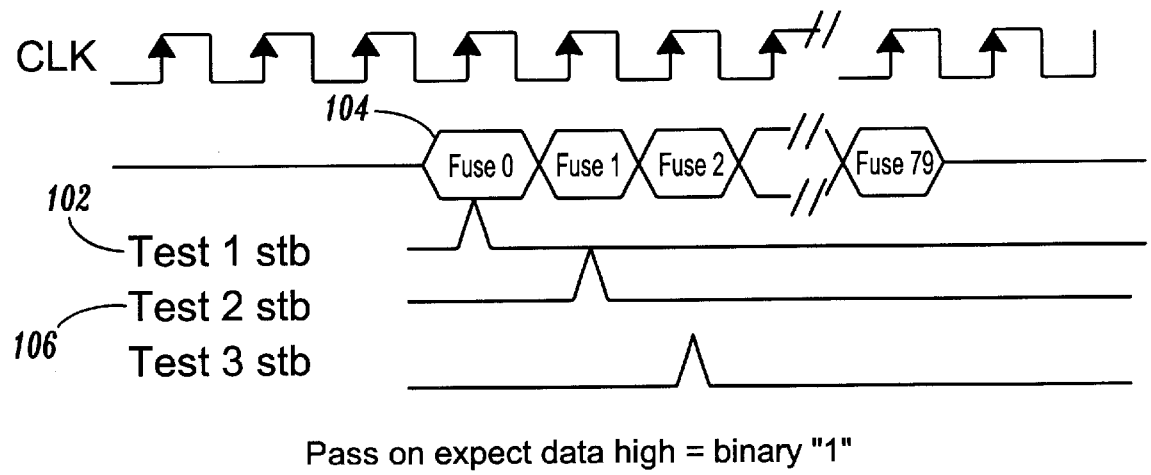
FIG. 1A is an illustration of a method of strobing fuses according to one embodiment of the present invention.

The present invention is directed to reading chip identification (ID) information from a parallel system and burn-in test board. A chip ID may include information, such as, wafer lot number, wafer number, and coordinates on a wafer. Preferably, the state of a defined group of fuses (open or closed) constitutes the chip ID. A test gate can then read the chip ID for purposes of tracing dies, wafers, and/or chips through production. Yield studies can be conducted using the information derived from the chip ID and/or tracing. In addition, process window analysis can be conducted for determining a fuse's impact on a test gate.

It is to be understood that the present invention may be implemented in various forms of hardware, software, firmware, special purpose processors, or a combination thereof. In one embodiment, the present invention may be implemented in software as an application program tangibly embodied on a program storage device. The application program may be uploaded to, and executed by, a machine comprising any suitable architecture. Preferably, the machine is implemented on a computer platform including hardware such as one or more central processing units (CPU), a random access memory (RAM), and input/output (I/O) interface(s). The computer platform also includes an operating system and micro instruction code. The various processes and functions described herein may either be part of the micro instruction code or part of the application program (or a combination thereof) which is executed via the operating system. In addition, various other peripheral devices may be connected to the computer platform such as an additional data storage device and a printing device.

It is to be further understood that, because some of the constituent system components and method steps depicted in the accompanying Figures may be implemented in software, the actual connections between the system components (or the process steps) may differ depending upon the manner in which the present invention is programmed. Given the teachings of the present invention provided herein, one of ordinary skill in the related art will be able to contemplate these and similar implementations or configurations of the present invention.

The present invention provides a system and method of data collection in a parallel system. According to the present invention, a chip ID includes one or more fuses, and for purposes of this disclosure an illustrative example will be presented wherein the chip ID includes eighty bits or fuses.

Preferably, the chip ID is read prior to burn-in testing, while the chip (typically a plurality of chips in parallel) are wired to a burn-in test board. The present invention can also be implemented after the burn-in test. The chip ID is preferably unaffected by the burn-in test.

After a mode register set command, a test mode for chip ID can be issued. By invoking a test mode, for example, by using a command particular to the chip design being tested, the chip ID is output to an output pin. The method strobes 102 the output to determine a chip ID bit 104. The strobe is a sampling method, wherein an expected data is compared to the output of the chip ID fuses and testing board. For example, referring to the illustrative example of an eighty bit chip ID, the strobe samples the output every eighty bits until the bit being captured, e.g., fuse 0, is captured for each chip in the test. The fuse data is sequentially clocked out of an input/output line until all fuses are read, for example, for a chip with eighty fuses, the chip ID for each fuse is output eighty times.

The expected data used for comparison can be, for example, data high which is the same as a binary "1". In general terms, a strobe is a signal that validates data or other signals on adjacent parallel lines, therefore, one skilled in the art would recognize, in light of the present invention, that other strobes and sampling techniques can be used.

Referring to FIG. 1A, a first test (102) is invoked to strobe a first fuse (e.g., 104) in the chip ID of each chip with expect data high (e.g., "1" or high). The method includes an addressing program for selecting individual fuses for testing. For example, for a chip with eighty ID fuses, the method performs eighty strobes, one for each fuse. The strobe or sampling of the fuse identification output captures one bit (e.g., 102) of data from each chip being tested before beginning to strobe (e.g., 106) the next fuse. The method compares the fuse's output or bit to an expected data to determine whether the fuse is closed or open.

A closed fuse can be defined as a pass or "1", and an open fuse can be defined as a fail or "0". Accordingly, if the output of a fuse, invoked by the test mode, is a "1" and is compared to an expect data high (e.g., "1") then the result is a pass or "1". Alternatively, if the fuse output is a "0", then the fuse is a fail or "0" as compared to the expected data high. One skilled in the art would recognize, in light of the present invention, that the system and method can also implement a strobe with an expect data low (e.g., a binary 0).

Figure 1B:
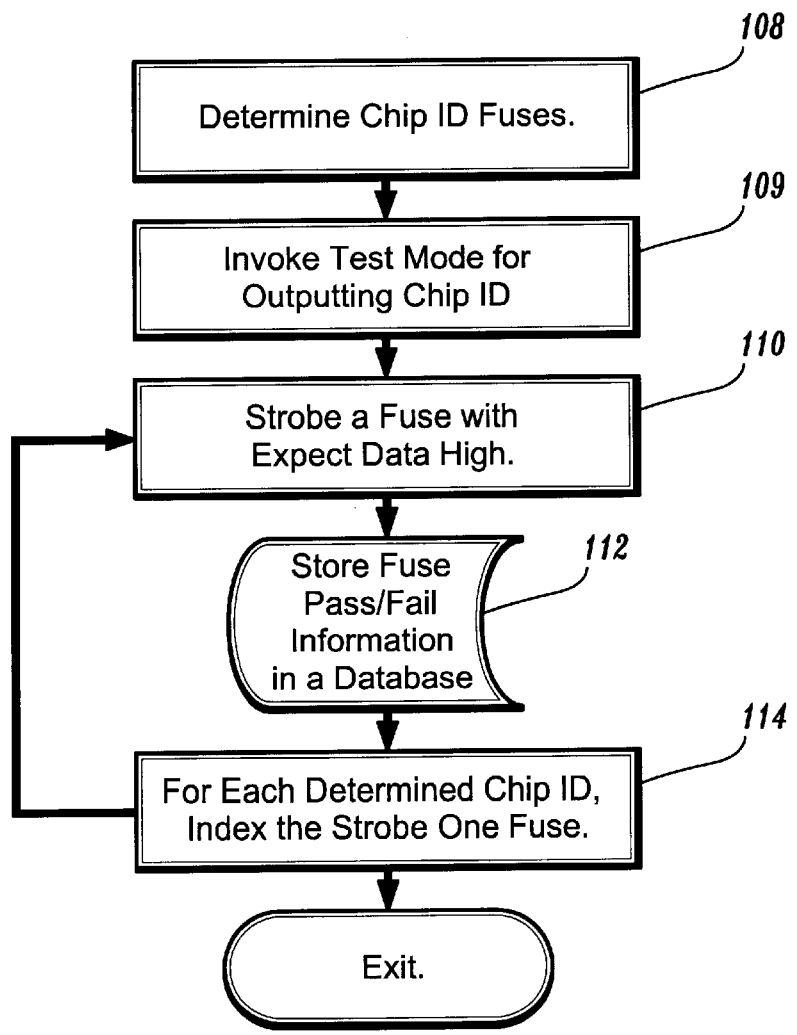
FIG. 1B is a flow chart showing the method illustrated in FIG. 1A.

Referring now to FIG. 1B, the invention defines the number of chip ID fuses 108. A test mode is invoked for the particular chip design being tested causing the chips to output their chip ID's 109. The chip ID is output sequentially until all fuses have been sampled. A first chip ID bit (for each chip being tested) is sampled from the serial output and compared to an expected data 110. The resulting information is interpreted (as above) as a pass or a fail and is stored in a database 112. The method is looped so that each fuse in the chip ID is strobed 114, the interpreted pass/fail results form a binary string. The pass/fail data string (binary chip ID) is loaded into a database.

A Structured Query Language (SQL) program can be executed against a relational database to translate the binary string of chip ID bits, for example, as shown in FIG. 5. SQL is a standard interactive programming language for retrieving and updating information in a database. The SQL expressions are generated in a format for directing input to a computer including the relational database. The relational database is preferably an offline database, one that is not part of the burn-in tester (oven). FIG. 4 is an example of one relational database structure including a test result string 402. The test result string 402 includes chip ID bits. The four preceding columns 404 in FIG. 4 contain lot number, equipment type, and coordinates, though any chip information can be included.

As stated above, in a parallel system and burn-in board, only one data line (package pin) is enabled. The devices (e.g., SDRAM) are tested in banks on a burn-in board to minimize tester electronics. While one pin is read active (enabled) during burn-in testing, the remaining pins are set to high-impedance, or tri-state, to avoid bus contention. A tri-state circuit (combinational or sequential) is an ordinary circuit including an additional input, which may be called, "enable". For example, when the enable input is 1, the circuit behaves like the corresponding normal (not tri-state)

circuit. However, when the enable input is 0, the outputs are disconnected from the rest of the circuit. The tri-state design is one way of isolating the test pin.

Figure 2:
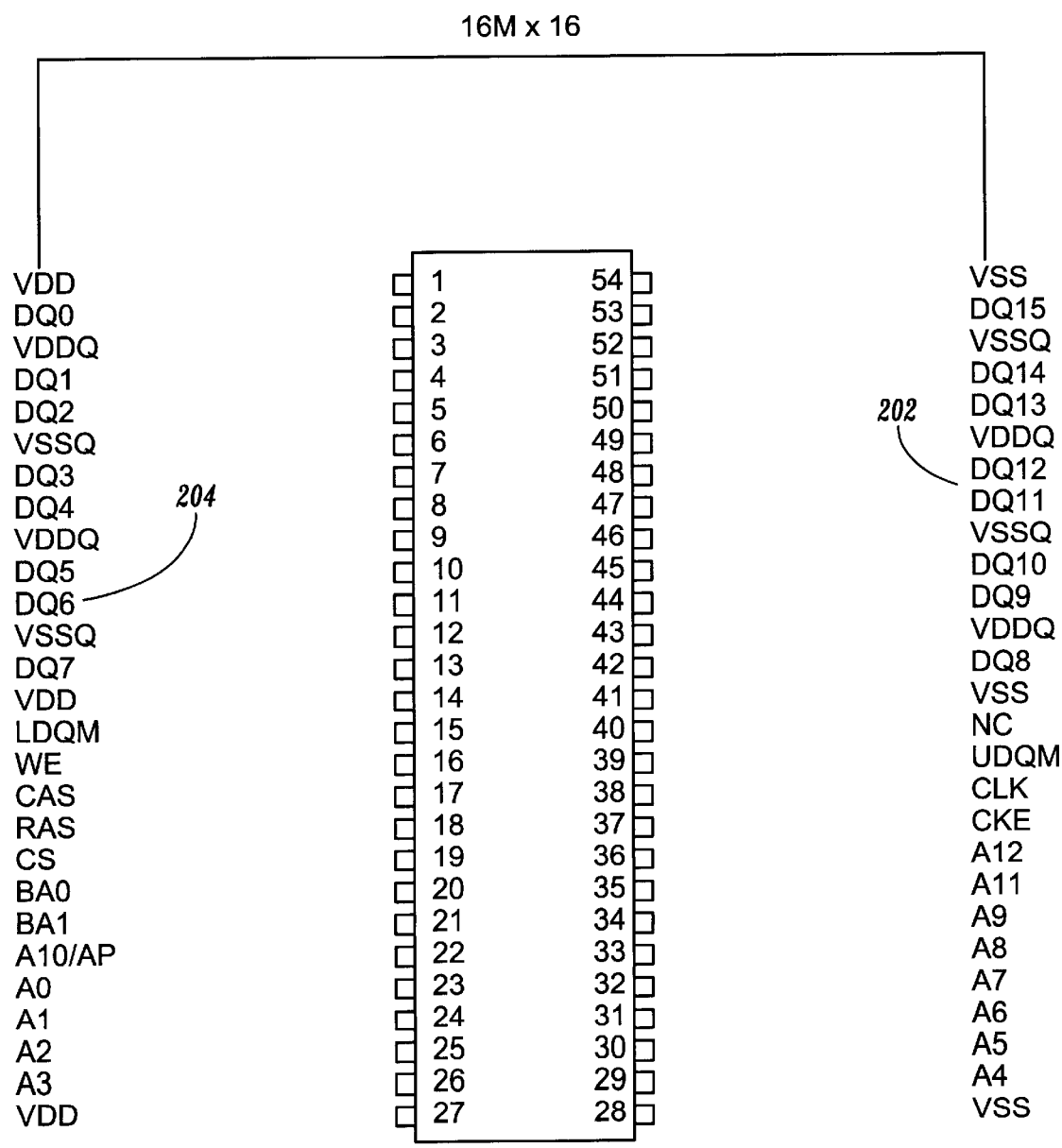
FIG. 2 is an illustration showing illustrative positions of data lines according to another embodiment of the present invention.

According the present invention, to avoid bus contention, the chip ID data appears on the package pin utilized during the test and burn-in process. Accordingly, a design for the chip ID pin is disclosed. For example, for an Infineon SDRAM, as shown in FIG. 2, chip ID information appears on data line (package pin) DQ11 202, while DQ6 204 is used during by the burn-in system. The fuse information can be read at DQ11 (bi-directional data line 11 or data out 11) starting at the third rising clock edge. One embodiment of the present invention moves the chip ID from DQ11 202 to DQ6 204, DQ6 204 being the package pin used for burn-in testing of an Infineon SDRAM. The data line/pin designations are known in the art and vary between chip designs. In addition, the pins not used during testing are disabled using the tri-state logic described above. Therefore, one skilled in the art will recognize that the present invention can be implemented on other chips including different data line configurations.

The burn-in test data is useful because it is run in conjunction with an integrated circuit stress test. Since the burn-in stress process accelerates the aging of the device, the burn-in test produces the highest percentage of fails for analysis. The present invention proposes a method for reading chip ID allowing chips to be traced though the burn-in test.

Preferably, the present invention is performed prior to the burn-in test. The chip ID fuse read results are loaded into the burn-in database along with the results of the burn-in tests. The present invention translates the chip ID string into chip ID fields using a SQL expression as described above. Once these chip ID fields are filled, the database table can be linked with other test data from other test gates in the flow. The resulting fields can be used to link the burn-in test data with other test gates. As depicted in FIG. 5, these fields can include, for example, wafer lot 502, wafer number, 504 x-coordinate 506, and y-coordinate 508. Additional fields can also be included, such as, the data string 510, and fabrication information 512.

Figure 3:
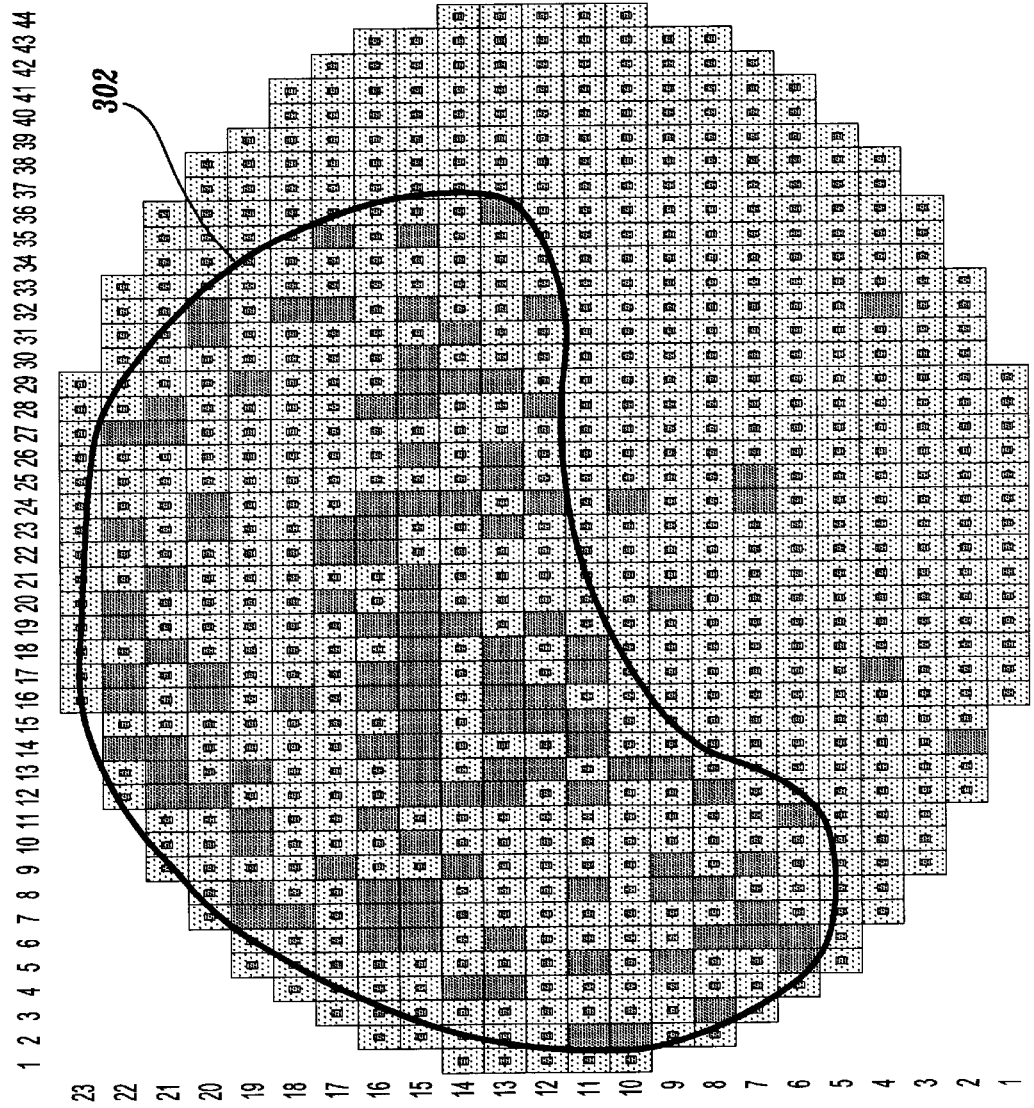
FIG. 3 is an illustration showing a wafer region fail map having a concentration of burn-in fails according to yet another embodiment of the present invention.

Chip tracing allows testers to examine lot performance by wafer lot and wafer region. A wafer region fail map, as shown in FIG. 3, provides valuable, high-resolution information regarding the burn-in test fails and how they relate to the wafer fabrication process. In FIG. 3, the concentration of burn-in test fails 302 can be seen. The wafer map and database information can be used to analyze yields and make improvements in production.

The present invention can also be used in window lot analysis. Window lot analysis can be helpful in determining a sensitivity variance in a semiconductor chip while tracking the variance as a function of time. Based on the process window analysis, a recipe database (for a particular semiconductor chip) can be integrated (with the analysis) so that specific recipes, including preset, user-specified parameters, can be called up automatically during the production process. Linking preset recipes with automated production can optimize run-to-run and lot-to-lot reproducibility and accuracy.

Having described embodiments of a method for reading semiconductor die information in a parallel test and burn-in system, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set for in the appended claims.

What is claimed is:

1. A method for determining memory device identification comprising the steps of:

invoking a serial output from n identification fuses of a plurality of devices, the serial output for identifying the devices;

sampling the serial output every $n^{th}$ bit to determine a fuse state for a fuse of each device;

repeating the sampling for all n fuses to acquire fuse data for all devices; and determining a pass/fail string corresponding to the sampled output, the pass/fail string being employed to identify through a parallel test and burn-in system, wherein the sampled output is on an enabled data line also used for a burn-in test wherein other data lines are disabled for avoiding bus contention.

2. The method of claim 1, wherein the memory device is a synchronized dynamic random access memory.

3. The method of claim 1, wherein the fuses are defined as identification fuses prior to invoking the serial output.

4. The method of claim 1, further comprising the steps of:

storing the pass/fail string for the data in a database; and translating the pass/fail string using a structured query language expression executed against the database.

5. The method of claim 4, wherein a pass is interpreted as a binary "1" and a fail is interpreted as a binary "0".

6. The method of claim 4, wherein the pass/fail string is a binary data string.

7. The method of claim 4, wherein the translated pass/fail string is linked to another test.

8. The method of claim 1, wherein the disabled data lines are tri-state data lines.

9. A program storage device readable by machine, tangibly embodying a program of instructions executable by the machine to perform method steps for determining memory device identification, the method steps comprising:

invoking a serial output from n identification fuses of a plurality of devices, the serial output for identifying the devices;

sampling the serial output every $n^{th}$ bit to determine a fuse state for a fuse of each device;

repeating the sampling for all n fuses to acquire fuse data for all devices; and determining a pass/fail string corresponding to the sampled output, the pass/fail string being employed to identify through a parallel test and burn-in system, wherein the sampled output is on an enabled data line also used for a burn-in test wherein other data lines are disabled for avoiding bus contention.

10. The method of claim 9, further comprising:

storing the pass/fail expression for the data in a database; and executing structured query language computer readable program code against the database for causing a computer to translate the pass/fail expression.

11. A system for determining memory device identification, comprising:

a testing board to which a plurality of memory devices are wired in parallel, each memory device including one or more identification fuses;

a strobe for sampling and comparing an output from the plurality of memory devices on an enabled package pin to an expected data, wherein the enabled package pin is used for burn-in testing wherein other pins are disabled for avoiding bus contention; and a memory for storing the results of the comparison.

12. The system of claim 11, wherein the memory further comprises:

a first relational database for storing the results against which a structured query language expression is executed for translating the results; and a second relational database including at least one identification field for accepting the translated data string.

13. The system of claim 11, wherein the memory is an offline memory.

14. The system of claim 11, wherein the memory devices are synchronous dynamic random access memories.

* * * * *